United States Patent

Ferrell

[15] 3,693,248

[45] Sept. 26, 1972

[54] SURFACE INVERSION PROTECTION METHOD AND APPARATUS

[72] Inventor: Jared F. Ferrell, 109 Belhaven Drive, Los Gatos, Calif. 95030

[22] Filed: April 6, 1970

[21] Appl. No.: 31,061

Related U.S. Application Data

[62] Division of Ser. No. 772,191, Oct. 31, 1968, Pat. No. 3,519,897.

[52] U.S. Cl. ........................................29/570, 29/578
[51] Int. Cl. ...........................B01j 17/00, H01g 9/00
[58] Field of Search ........29/570, 571, 578; 148/186; 317/235 B, 234 C

[56] References Cited

UNITED STATES PATENTS 3,440,502 4/1969 Lin et al. ................317/235 B

*Primary Examiner*—John F. Campbell
*Assistant Examiner*—W. Tupman
*Attorney*—Harvey G. Lowhurst

[57] ABSTRACT

A novel metal-insulator-semiconductor capacitor device and method of manufacture wherein means are provided for narrowly defining the boundaries of the inversion region lying beneath the metallic electrode disposed on the surface of the semiconductive chip. An impurity region highly doped with an appropriate dopant is provided around the intentional inversion region for delimiting the area thereof as well as prohibiting an unintentional expansion of this area due to spurious inversion of the substrate surface caused by accumulation of surface charge on the overlying dielectric.

3 Claims, 9 Drawing Figures

INVENTOR
JARED FERRELL

Harvey J. [signature]
ATTORNEY

SURFACE INVERSION PROTECTION METHOD AND APPARATUS

This application is a division of my copending application, Ser. No. 772,191, filed Oct. 31, 1968.

BACKGROUND OF THE INVENTION

As the use of certain crystalline orientations becomes more prevalent for the starting substrate of integrated circuit devices, it has become apparent that new techniques must be developed to eliminate spurious inversion of the substrate underlying an oxide layer due to accumulation of surface charge on the oxide or other dielectric covering the semiconductive material. As an example, previously used silicon substrate material (orientation 1–1–1) had an inversion potential of about 30 to 35 volts for a 10,000 A oxide and 2.5 Ω-cm substrate material, but the more recently used material (orientation 1–0–0) has an inversion potential of perhaps 14 to 15 volts. Obviously, it takes less charge on the surface of an overlying dielectric to invert the newer material than to invert the previous material.

The surface charge which is of concern in some cases, may be the result of a static charge occurring on the dielectric surface, but is more readily attributable to such phenomena as the migration of ions onto the dielectric from a metallic surface, the presence of some contamination in the oxide, or the polarization of the oxide under an applied bias. Notwithstanding the fact that the precise cause of the charge is usually not known, it is known, however, that such charge does exist and that it is a factor which must be dealt with when using the newer silicon crystalline orientations.

The primary consequence of the dielectric surface charge accumulation is that since the charge cannot be controlled by applying a bias to a portion of the dielectric surface, the charge can build up on the dielectric around the metallic plate of a metal-insulator-semiconductor (MIS) capacitor, for example, and cause an inversion of the semiconductive surface therebeneath which will result in an uncontrollable and undesirable expansion of the intended inversion plate of the capacitor.

In the case of the MIS capacitor device, a metallic field plate is typically insulated from a semiconductive substrate with an oxide layer, and the substrate under the field plate is caused to invert by the application of a bias potential to the plate, thus effectively creating a capacitor which is in series with the normal metal-insulator-semiconductor capacitance. Ideally, one would like to have the value of this capacitance determined by the particular geometry of the metal plate. But where the inversion potential of the substrate is low enough to make extraneous surface charge of material concern this charge may cause portions of the substrate outside the perimeter of the plate to become inverted and thus effectively increase the lower plate area and the resulting capacitive characteristics by an uncontrollable amount.

This is obviously an undesirable feature in applications where a fixed capacitance is required. And it is even more undesirable in the case where one wishes to make a voltage variable capacitor, the capacitance of which is determinable by the magnitude of the bias potential applied thereto.

SUMMARY OF THE INVENTION

The present invention related generally to metal-insulator-semiconductor (MIS) devices and more particularly to a method and apparatus for eliminating the deleterious effect of surface charge on a MIS device due to the unintentional inversion of certain areas of the substrate.

In accordance with the present invention, a barrier-like region of highly doped semiconductive material having the same conductivity type dopant as the starting substrate is provided so as to delimit the area in which intentional inversion is allowed to occur. In the MIS capacitor, for example, the intended inversion region is narrowly defined by a highly doped barrier region, so as to insure that the electrical characteristics of the device are reliable and predeterminable.

It is therefore a principal object of the present invention to provide a method and means for improving the reliability of a MIS capacitor device by shielding the device against the effects of inversion, due to extraneous surface charge occurring on the substrate insulator layer.

Other objects and advantages of the present invention will become apparent to those of skill in the art after having read the following disclosure of the preferred embodiments which are illustrated in the several figures of the drawing.

IN THE DRAWING

DESCRIPTION OF THE PREFERRED EMBODIMENTS

Figure 1:
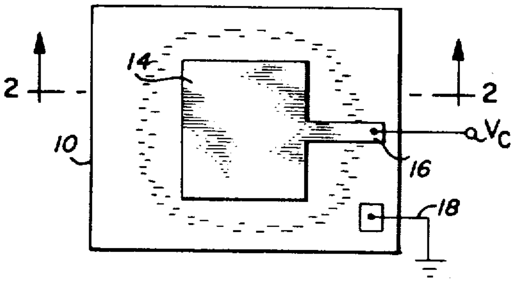
FIG. 1 is a plan view of a prior art metal-insulator-semiconductor capacitor, illustrating the effects of surface charge inversion.
Figure 2:
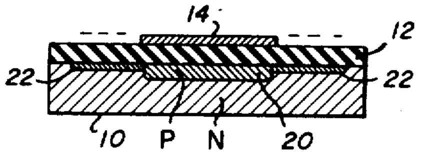
FIG. 2 is a cross-section of the capacitor of FIG. 1, taken along the line 2—2, and showing the substrate in its inverted condition.
Figure 3:
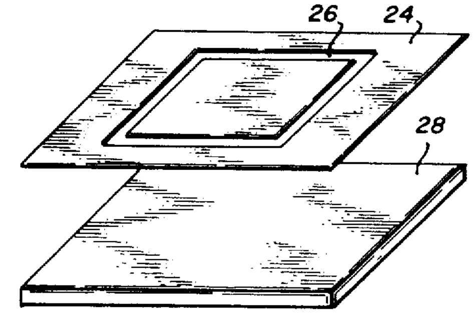
FIGS. 3 through 7 illustrate exemplary operative steps which may be followed in manufacturing a metal-insulator-semiconductor capacitor in accordance with the subject invention.

Referring now to FIGS. 1 and 2 of the drawing, a typical prior art metal-insulator-semiconductor (MIS) capacitor is illustrated which comprises a wafer 10 of N-type semiconductor material, for example, upon which an oxide layer 12 has been grown covering the entire upper surface of the wafer. The layer 12 need not, however, be an oxide, but may be a thin layer of any suitable dielectric material. Disposed upon the surface of the wafer 10 and insulated therefrom by the dielectric layer 12 is a metallic electrode 14 having a connector portion 16 to which a suitable source of potential $V_c$ may be connected. The semiconductor substrate 10 is connected to ground by a suitable interconnect means 18.

Since the structure as thus far described consists of a metallic conductive surface 14 and a semiconductive surface 10, the two being separated by a thin insulative layer 12, it is easily recognized that the structure has capacitive properties. However, since the semiconductive layer 10 is N-type and basically neutral to begin with, a negative charge applied to the metallic electrode 14 will tend to drive away the neutralizing electrons in the region 20 lying beneath the electrode 14, leaving the positive ions exposed, so to speak, so that the semiconductor in this region becomes P-type in character since it can now accept electrons. Thus, the region 10 lying beneath the electrode 14 is said to become inverted.

As the degree of inversion is proportional within certain limits to the charge applied to the electrode 14, so is the capacitance of the structure. However, as mentioned above, it is quite common for extraneous charge to become accumulated upon the surface of the dielectric layer 12 around the electrode 14. If this accumulated charge reaches a magnitude sufficient to cause inversion of the underlying substrate 22, the effect is to increase the size of the inverted area 20 lying under the electrode 14, thus increasing the capacitance above that attributable to a given bias potential applied to the plate 14.

This unintentional increase in "plate" size is a very undesirable occurance where one wishes to either maintain a fixed capacitance, or to provide a variable capacitance having predictable operating parameters since the extraneous charge which might accumulate on the dielectric is completely uncontrollable and certainly unpredictable.

In FIGS. 3 through 9 of the drawing, a method and apparatus is disclosed which, in accordance with the present invention, permits the area of the intended inversion region 20 to be sharply delineated, so that the capacitance achieved by inversion as a result of applied bias is predictable and independant of accumulated surface charge.

In accordance with this embodiment, a first mask 24 having a generally rectangular shaped aperture 26 is provided over the N-type substrate 28 and the composite is subjected to a highly concentrated antimony diffusion so as to cause a highly doped N+ region 30 to be diffused into the surface of the substrate 28. The mask normally used is an oxide layer grown on the silicon with the aperture etched open. This oxide layer is then wholly or partially etched away after serving its masking function. Although any suitable N-type impurity may be used, antimony is preferably employed as the dopant since the wafer may subsequently be subjected to an series of high temperature operations after predisposition and diffusion without materially affecting the physical proportions of the region 30. This is, of course, due to the low diffusion coefficient of antimony.

Figure 4:
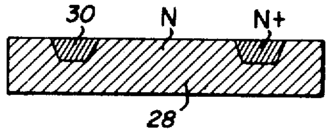
Figure 5:
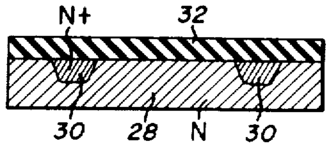
Figure 6:
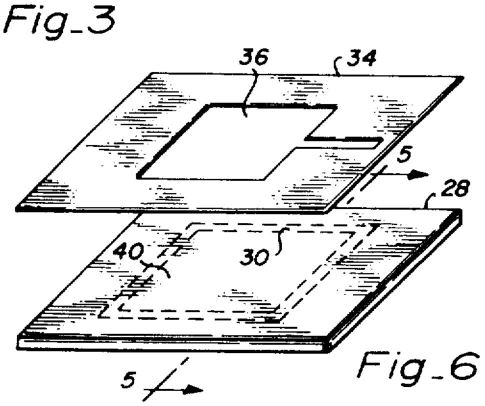
Figure 7:
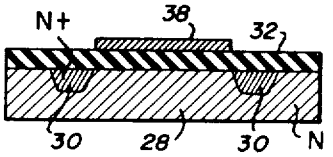

After the first diffusion is carried out, the resulting wafer is of the form shown in the cross-section of FIG. 4 and a layer of insulating oxide 32 is thereafter grown over the upper surface as shown in FIG. 5. A metal mask 34, having an aperture 36, is then provided over the substrate 28, as shown in FIG. 6, and the capacitive plate 38 is deposited on the oxide surface over the N-type region 40 of substrate 28 which is defined by the rectangular N+ region 30. In an alternate metallizing technique a layer of aluminum is evaporated over the entire surface of the wafer and then the unwanted areas are etched away. It should also be noted that a means 38 must be provided for allowing an ohmic connection to be made to the substrate 28. This can be provided in any of several ways well known in the art and is therefore only shown schematically herein.

Figure 8:
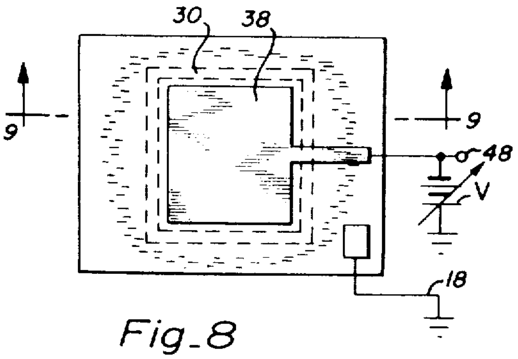
FIG. 8 is a plan view of a metal-insulator-semiconductor capacitor, illustrating the novel features of the present invention.
Figure 9:
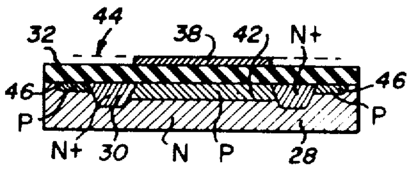
FIG. 9 is a cross-section of the capacitor of FIG. 3, taken along the line 4—4, illustrating the inverted substrate.

Referring now specifically to FIGS. 8 and 9, it may be seen that when a biasing potential is applied to the plate 38, the underlying substrate will be caused to invert as previously described. However, since the N+ region 30 is positioned around the periphery of the substrate area 40 underlying the plate 38, and since the impurity concentration of the region 30 is sufficient to resist inversion over the design range of plate potentials, the induced inversion area 42 will be narrowly defined. And any charge 44 which tends to accumulate on the surface of the dielectric around the plate 38 will therefore be prevented from enlarging the size of the inversion plate 42.

Should the charge 44 accumulate to such a level as to produce an inversion region 46 in the substrate outside the barrier region 30, this will have no effect on the capacitance since the width of the barrier region 30 is chosen wide enough to provide sufficient special isolation between this region and the capacitor structure, Thus, in accordance with the invention, a metal-insulator-semiconductor capacitor structure has been disclosed the capacitive value of which can be accurately controlled or selected by the application of predetermined levels of potential thereto by providing a suitable variable biasing potential supply means V, for example, a variable value of capacitance can be obtained at terminal 48. Such capacitance structures will find wide application as capacitive tuning elements as well as in other areas of utility where a controllable capacitance may be required.

Whereas the above illustrative example has been described as including an N-type substrate and an N+ buried region 24, it is to be understood that the substrate might just as well be P-type in which case the region 24 would be made P+. Furthermore, it is not necessary that the semiconductor regions or metallic electrode 14 be rectangular in shape since they may take any suitable configuration.

Although the invention has been described with reference to a single capacitance element, it is to be understood that the element may be a part of an integrated circuit or may be fabricated as a bank of single valued or variable capacitors on a single chip of semiconductor substrate.

Although the above described embodiment has for illustrative purposes been referred to as a metal-oxide-semiconductor (MOS) device produced by a multistage diffusion process it is to be understood that the invention relates equally to any metal-insulator-semiconductor (MIS) process or device and the various regions could be just as well produced by an epitaxial or any another suitable process.

After having read the above disclosure, it will be apparent to those of skill in the art that many alterations and modifications can be made to the subject invention without departing from the merits thereof. It is, therefore, to be understood that this description is for purposes of illustration only, and is in no way intended to be of a limiting nature. Accordingly, I intend that the appended claims to interpreted as covering all modifications which fall within the true spirit and scope of my invention.

What is claimed is:

1. A method of making a metal-insulator-semiconductor capacitor means including means for delimiting the substrate area which is to be intentionally caused to invert and for isolating this area from any outlying surface areas which may be caused to invert due to accumulated surface charge on the dielectric layer covering the surface of the substrate, comprising:

diffusing into a substrate of a first conductivity type a belt-like region of highly concentrated impurity of said first conductivity type delimiting an area in said substrate;

providing a dielectric coating on the surface of said substrate covering said belt-like region and the area delimited thereby; and providing a metallic electrode means disposed above and overlying said delimited area within said belt-like region and electrically isolated therefrom by said dielectric coating and wherein said metallic electrode means is shaped to overlie substantially the entire delimited area.

2. The method of claim 1 further including providing a source of electrical potential for biasing the metallic electrode means of said capacitor means so as to cause the underlying substrate to experience inversion and thus change the capacitive characteristic between the metallic electrode and the underlying delimited area of the substrate.

3. The method of claim 1 wherein the width of said belt-like region is narrow as compared with the width of said metallic electrode.

* * * * *